(12) United States Patent
Lammer

(10) Patent No.: US 6,861,782 B2
(45) Date of Patent: Mar. 1, 2005

(54) FLEXIBLE PIEZOELECTRIC FILMS

(75) Inventor: Herfried J. Lammer, Lochau (AT)

(73) Assignee: Head Sport AG, Kennelbach (AT)

( * ) Notice: Subject to any disclaimer, the term of this patent is extended or adjusted under 35 U.S.C. 154(b) by 38 days.

(21) Appl. No.: 10/117,151

(22) Filed: Apr. 4, 2002

(65) Prior Publication Data

US 2003/0030249 A1 Feb. 13, 2003

Related U.S. Application Data

(60) Provisional application No. 60/282,274, filed on Apr. 5, 2001.

(51) Int. Cl.[7] .............................................. H01L 41/09
(52) U.S. Cl. ....................................................... 310/317
(58) Field of Search ........................... 310/316.01, 317, 310/339

(56) References Cited

U.S. PATENT DOCUMENTS

| | | | | |
|---|---|---|---|---|
| 4,363,993 A | * | 12/1982 | Nishigaki et al. | 310/332 |
| 4,849,668 A | * | 7/1989 | Crawley et al. | 310/328 |
| 5,032,753 A | * | 7/1991 | Yamaguchi et al. | 310/317 |
| 5,775,715 A | | 7/1998 | Vandergrift | 280/602 |
| 5,873,973 A | * | 2/1999 | Koon et al. | 156/272.4 |
| 6,048,276 A | | 4/2000 | Vandergrift | 473/316 |
| 6,095,547 A | * | 8/2000 | Vandergrift et al. | 280/602 |
| 6,191,519 B1 | * | 2/2001 | Nye et al. | 310/316.01 |
| 6,324,920 B1 | | 12/2001 | DeSchrijver | 73/862.046 |
| 6,345,834 B1 | * | 2/2002 | Bianchini et al. | 280/602 |
| 6,485,380 B2 | * | 11/2002 | Spangler et al. | 473/521 |
| 6,486,589 B1 | * | 11/2002 | Dujari et al. | 310/331 |
| 2003/0127944 A1 | * | 7/2003 | Clark et al. | 310/316.01 |

* cited by examiner

Primary Examiner—Thomas M. Dougherty
(74) Attorney, Agent, or Firm—Finnegan, Henderson, Farabow, Garrett & Dunner, L.L.P.

(57) ABSTRACT

A piezoelectric device having a piezoelectric film and methods of making such. The piezoelectric device can be used in circuits to dampen or dissipate vibrations in equipment such as racquets, and ski apparatus.

7 Claims, 6 Drawing Sheets

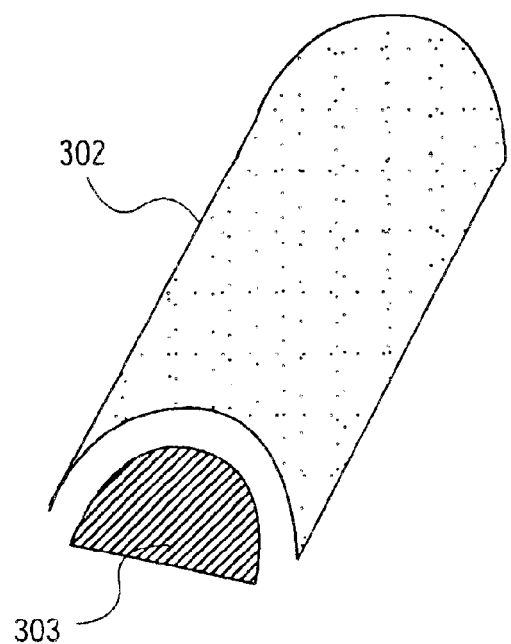
FIG. 3A
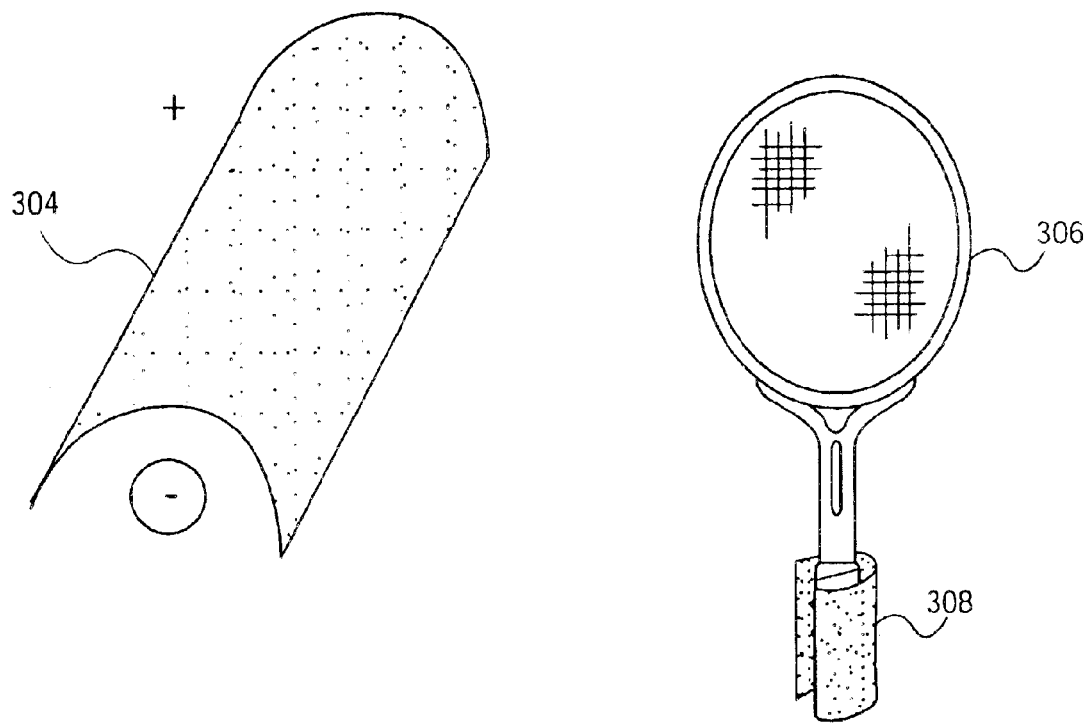
FIG. 3B  FIG. 3C

FLEXIBLE PIEZOELECTRIC FILMS

RELATED APPLICATIONS

Applicant claims the right to priority under 35 U.S.C. §119(e) based on Provisional Patent Application No. 60/282,274 entitled "METHODS AND SYSTEMS FOR MANUFACTURING AND USING FLEXIBLE PIEZOELECTRIC FILMS," filed Apr. 5, 2001, and which is expressly incorporated herein by reference in its entirety.

FIELD OF THE INVENTION

The present invention relates to piezoelectric materials, and, more particularly, flexible piezoelectric films and methods for manufacturing and apparatus for using such films.

BACKGROUND OF THE INVENTION

Piezoelectric materials can have various properties. In particular, polarized piezoelectric materials can produce electric potentials between electrodes attached at opposing sides in response to vibration of the piezoelectric material. In addition, electrical potentials of a predetermined frequency can be applied to electrodes attached at opposing sides of a polarized piezoelectric material to produce mechanical vibrations in the material.

In conventional manufacturing processes, piezoelectric materials can be formed in bulk by sintering oxides, including but not limited to lead oxide, zirconium oxide, and titanium oxide into a block or a cylinder. Prior to sintering, the oxides are bound together with an organic binder such as wax or nylon. The sintering process can take place in a kiln at high temperature, e.g., 1200 degrees Celsius. The sintering process is similar to that used in forming ceramics.

Blocks of piezoelectric material can be cut into thin slices that are brittle because of the characteristics of the piezoelectric material. The thin slices can then be polarized using an electric field. Electrodes are attached to the thin piezoelectric slices so as to cover an entire surface of the slice or form an interdigitated pattern on a surface of the slice. Conventionally, sets of electrodes can be connected on the same or opposing sides of the slice of piezoelectric material. A set of interdigitated electrodes can also be connected to the same or opposing sides of the slice of piezoelectric material by way of finger-like electrodes. These finger-like electrodes can be connected to the same or opposing surfaces of the material. The polarized piezoelectric slices with attached electrodes are often referred to as "piezoelectric elements."

Piezoelectric elements can be affixed to objects to convert mechanical energy, in the form of vibration, to electrical current or to convert electrical current to mechanical energy, in the form of vibration. Piezoelectric elements known in the art are brittle and, therefore, poorly suited for application to uneven surfaces. Similarly, subjecting piezoelectric elements known in the art to stress results in fracture.

Piezoelectric elements can be used in a variety of applications, including but not limited to racquets (such as tennis, racquetball, squash), and ski apparatus. It is desirable to use piezoelectric elements for in these applications to dampen or dissipate vibrations as well as other applications.

For example, depending upon where a tennis ball strikes the strings of a tennis racquet, conventional tennis racquets generate vibrations in the frame and handle. These vibrations can negatively affect the performance of a tennis racquet, and can be unpleasant or physically problematic for the user. Therefore, it is desirable to dampen the vibrations in the frame and handle of tennis racquets.

Skis and snowboards can go faster and generally turn better when a surface of the ski or snowboard is heated. Therefore, it is desirable to heat a surface of a ski or snowboard or similar device.

Additional benefits of the invention will be set forth in part in the description which follows, and in part will be obvious from the description, or may be learned by practice of the invention.

SUMMARY OF THE INVENTION

A method of making a flexible piezoelectric film comprising obtaining a piezoelectric material, reducing it to particles, and contacting the particles with a flexible matrix material. In one non-limiting embodiment, the piezoelectric material can comprise lead oxide, zirconium oxide, titanium oxide or combinations thereof. In one non-limiting embodiment, the particles can be contacted with an organic binder such as wax or nylon. In one non-limiting embodiment, sintering the piezoelectric material can make a ceramic material. In one non-limiting embodiment, the piezoelectric material can be reduced by ball milling or high energy bead milling.

In one non-limiting embodiment, the flexible matrix material can comprise epoxy resin, thermoset material, thermoplastic material, or combinations thereof. In one non-limiting embodiment, the piezoelectric material can comprise ammonium dihydrogen phosphate, potassium dihydrogen phosphate, barium sodium niobate, barium titanate, barium titanate (poled), litium niobate, lithium tantalite, lead zirconate titanate (such as PZT-2, PZT-4, PZT-4D, PZT-5H, PZT-5J, PZT-7A, PZT-8), quartz, Rochelle salt, bismuth germanate, cadmium sulfide, gallium arsenide, tellurium dioxide, zinc oxide, zinc sulfide, or combinations thereof.

A method of making a piezoelectric device comprising obtaining a piezoelectric film which comprises a piezoelectric material and a flexible matrix material, and applying electrodes to the film. In one non-limiting embodiment, the electrodes are applied in a uniform pattern on the film. In one non-limiting embodiment, the electrodes are applied in a interdigitated pattern on the film. In one non-limiting embodiment, the piezoelectric film can be polarized with an electromagnetic field.

A piezoelectric device comprising a piezoelectric film which comprises a piezoelectric material and a flexible matrix material, and electrodes connected to the film. In one non-limiting embodiment, the film is polarized with an electromagnetic field.

A method of making a piezoelectric film comprising obtaining a piezoelectric material which comprises lead oxide, zirconium oxide, titanium oxide, or combinations thereof, contacting the piezoelectric material with an organic binder, which comprises wax, nylon, or combinations thereof, sintering the piezoelectric material to make a ceramic material, milling the ceramic material into particles, contacting the particles with a flexible matrix material, molding the matrix material onto a surface, and curing the matrix material. In one non-limiting embodiment, electrodes can be applied to the matrix material. In one non-limiting embodiment, the matrix material can be polarized with an electromagnetic field.

A circuit comprising a piezoelectric device, which comprises a piezoelectric film, electrodes, and a member, where the piezoelectric film comprises a piezoelectric material and a flexible matrix material, and the electodes contact the member, whereby vibrations in the member can be dampened by tuning the circuit. In one non-limiting embodiment, the member comprises a resistance and a natural frequency, whereby the vibrations in the member are dampened by tuning the natural frequency of the circuit to the natural frequency of said member. In one non-limiting embodiment, the resistance can be adjusted by positioning carbon fibers within the member. In one non-limiting embodiment, the piezoelectric device is adapted to generate an electric potential, whereby the vibrations in the member are dampened by adjusting the electrical potential generated by the piezoelectric device to tune the frequency of the circuit to the frequency of the vibrations.

In one non-limiting embodiment, the member can be a frame of a racquet. In one non-limiting embodiment, the member can be a handle of a racquet. In one non-limiting embodiment, the member can be at least a portion of a ski apparatus.

A circuit comprising a piezoelectric device which comprises a piezoelectric film, electrodes, and a member, where the piezoelectric film comprising a piezoelectric material and a flexible matrix material, and where the electrodes contact the member, whereby vibrations in the member can be dissipated as heat. In one non-limiting embodiment, the circuit further comprises a metal wire adapted to generate heat connected to the piezoelectric device, wherein the piezoelectric device is adapted to generate an electric potential to dissipate the vibrations through the wire. In one non-limiting embodiment, the member can be a ski apparatus. In one non-limiting embodiment, the wire runs through an edge or a core of the ski apparatus.

It is to be understood that both the foregoing general description and the following detailed description are exemplary and explanatory only and are not restrictive of the invention.

BRIEF DESCRIPTION OF THE DRAWINGS

The accompanying drawings, which are incorporated in and constitute a part of this specification, illustrate various embodiments of the present invention and together with the description, serve to explain the principles of the invention. In the drawings:

FIGS. 3A–3C illustrate one embodiment in which a polarized piezoelectric film is attached to a tennis racquet consistent with the present invention;

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts.

For the purposes of this specification and appended claims, unless otherwise indicated, all numbers expressing size, proportions, dimensions, quantities, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Figure 1:
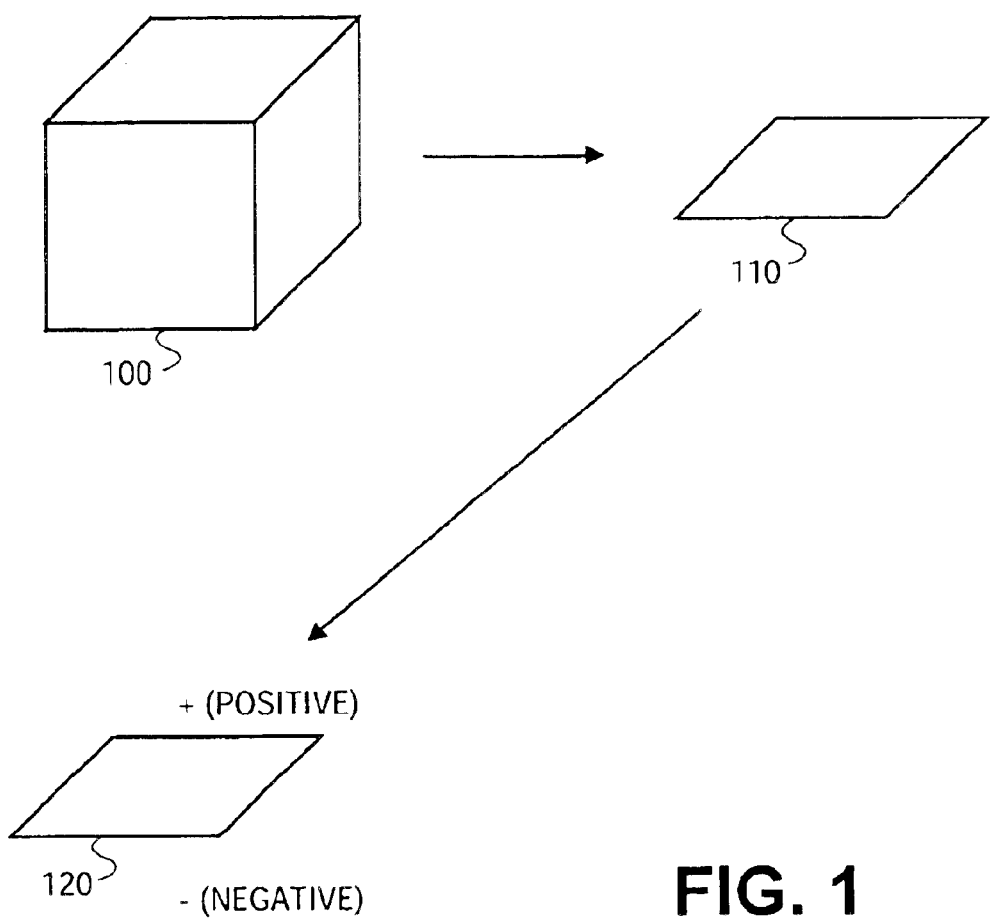
FIG. 1 illustrates conventional methods of manufacturing a piezoelectric element.

FIG. 1 illustrates conventional methods of manufacturing a piezoelectric element. In conventional systems, a block 100 of piezoelectric material is sliced into thin, brittle layers 110 of piezoelectric material. These thin layers are polarized by exposure to strong electromagnetic fields. Finally, polarized layer 120 is connected to electrodes on the same or opposing sides.

Figure 2:
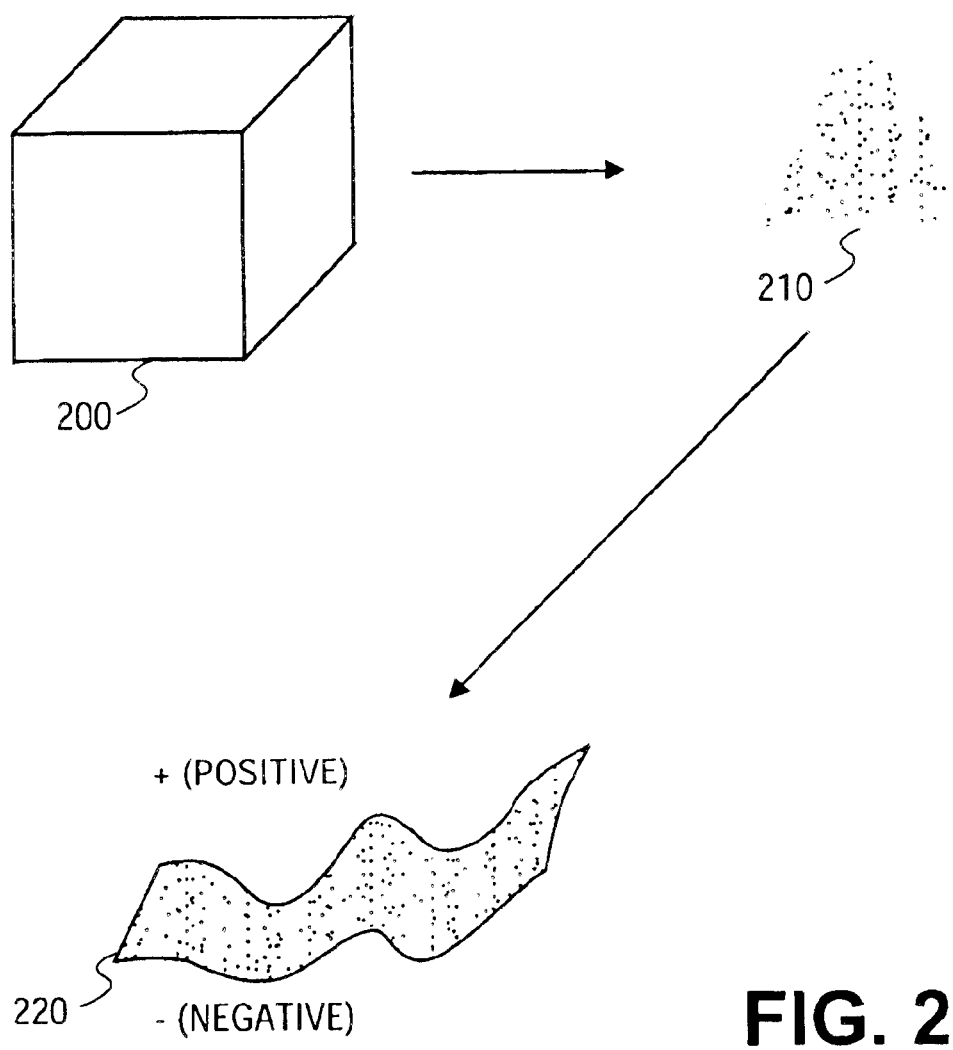
FIG. 2 illustrates one non-limiting embodiment of a method of manufacturing a piezoelectric film consistent with the present invention.

FIG. 2 illustrates one non-limiting embodiment of a method of manufacturing a piezoelectric film consistent with the present invention. A block of piezoelectric material 200 is milled into a fine piezoelectric powder 210. The piezoelectric powder 210 contains piezoelectric particles (not shown). Particles can have a wide range of sizes. Particles milled by ball milling range in size from 5 to 100 microns. Particles milled by high energy bead milling range in size from 200 to 600 nanometers. Particles milled with ball milling can achieve a density of 92–97% of sintering temperatures of 1175° C. to 1350° C. Particles milled with high energy bead milling can achieve a density of 96–99.5% at sintering temperatures of 1000° C.–1150° C. The piezoelectric material can be any of a number of known piezoelectric materials, such as oxides, including but not limited to lead oxide, zirconium oxide, and titanium oxide (when combined generally referred to as PZT) or polymers, metal, crystals or composite materials. PZT can be at least 50% lead oxide, with titanium oxide ranging from 1% to 50% and zirconium oxide ranging from 1% to 50%. Other examples of piezoelectric material include ammonium dihydrogen phosphate, potassium dihydrogen phosphate, barium sodium niobate, barium titanate, barium titanate (poled), litium niobate, lithium tantalite, lead zirconate titanate, (such as PZT-2, PZT-4, PZT-4D, PZT-5H, PZT-5J, PZT-7A, PZT-8), quartz, Rochelle salt, bismuth germanate, cadmium sulfide, gallium arsenide, tellurium dioxide, zinc oxide, zinc sulfide, from manufactures such as eFunda, Inc., Sunnyvale, Calif. and lead lanthanum zirconate titanate from manufactures such as Ecertec Ltd., Leeds, United Kingdom. The piezoelectric material can be any combination of these materials sintered into a ceramic material according to conventional methods. Alternatively, prior to sintering the piezoelectric material can be bound together with an organic binder such as wax or nylon.

Piezoelectric powder 210 is mixed with a flexible matrix material to form a film. The flexible matrix material can be an epoxy resin, a thermoset material, a thermoplastic, or any other flexible material that can be hardened. The flexible matrix material is further mixed with an appropriate hardener, or plasticizer. Example of flexible matrix materials from manufactures such as Hexcel Composites, Linz, Austria and Advanced Composites Group, Heanor, United Kingdom:

| Hexcel Composites | | | | | | | | | |
|---|---|---|---|---|---|---|---|---|---|
| Epoxy Resin System | Max. Service Temp. (dry) °C. (° F.) | Max. Service Temp. (wet) °C. (° F.) | Cure Cycle Time (mins) | Cure Cycle Temp °C. (° F.) | Cure Cycle P (Bar) | Min. Cure Temp. °C. (° F.) | Time at Min. Cure Temp (hours) | Outlife at Room Temp. (days) | Storage at −18° C. (0° F.) (months) |
| ES15 | 80 (176) | 60 (140) | 5 | 130 (266) | 5–8 | 120 (248) | 30 min | 4 | 6 |
| NTT5/ EF01 | 80 (176) | 60 (140) | 12 | 120 (248) | 1–10 | 85 (185) | 15 | 14 | 6 |
| ES/EH 84 | 90 (194) | 80 (176) | 90 | 120 (248) | 1–5 | 100 (212) | 2.5 | 30 | 7 |
| M32 | 100 (212) | 80 (176) | 9 | 120 (248) | 1–10 | 100 (212) | 45 min | 7 | 6 |
| M39 | 120 (257) | 100 (212) | 11 | 140 (284) | 1–10 | 120 (248) | 18 min | 40 | 12 |

| Thermo-Plastic Resin System | Service Temp. Range ° F. (° C.) | Typical Process Temp. ° F. (° C.) | Density (g/cc) |
|---|---|---|---|
| Nylon 6 | 150–350 (65–177) | 500 (260) | 1.12 |
| PP | 130–220 (54–104) | 400 (204) | 0.9 |
| PPS | 250–500 (121–260) | 625 (329) | 1.35 |
| PEI | 385–420 (196–215) | 675 (357) | 1.27 |
| PEEK | 350–600 (177–315) | 725 (385) | 1.32 |

| Advanced Composites | | | | |
|---|---|---|---|---|
| Epoxy Resin System | Max. postcure Temp. (° C.) | Max. Service Temp. (° C.) | Cure Cycle | Outlife at Room Temp. (days) |
| LTM23 | 130 | 100 | 40° C.-30 hrs 70° C.-3 hrs | 2–3 |
| LTM24ST | 120 | 100 | 50° C.-16 hrs 60° C.-10 hrs | 2–3 |
| MTM28 | 95 | 80 | 120° C.-1 hr | 30+ |
| MTM49 | 150 | 130 | 135° C.-1 hr | 30+ |
| MTM52 | 100 | 80 | 110° C.-10 mins Compression | 2 |
| MTM53 | 100 | 80 | 120° C.-10 mins Compression | 2 |
| MTM56 | 125 | 100 | 60° C.-16 hrs 120° C.-10 mins | 30+ |

The mixture of particles and the flexible matrix material has a dense concentration of particles and can be near or at saturation. In one non-limiting embodiment, a sufficient quantity of powder is added to the epoxy resin so that each of the particles is coupled with every other particle. In another embodiment, each particle is in contact with at least one other particle. In yet another embodiment, substantially all of the particles are in contact with one another either directly or indirectly via one of the other particles.

While the mixture is flexible and tacky, it can than be easily formed into piezoelectric film 220. The film can be molded into any form, like the handle of a tennis racquet, before being cured. Piezoelectric film 220 can be cured, or at least partially cured, using curing processes known to those of ordinary skill in the art. The film can be cured before it is applied to a surface or once it has been applied to a surface.

A piezoelectric device using the film can be made by attaching electrodes to the film and polarizing the film with an electromagnetic field to orient the electric dipoles. For a film having a thickness of 0.1 mm, a field of 1 kv/mm can polarize the film in 5 minutes.

FIGS. 3A–3C illustrate one non-limiting embodiment of a polarized piezoelectric film attached to a tennis racquet consistent with the present invention. FIG. 3A illustrates an application of an at least partially uncured film on a bare carbon prepreg of an unfinished tennis racquet.

Prepreg 303 can be composed of pre-impregnated unidirectional fibers. The fibers are impregnated with a resin, such as an epoxy resin, which is tacky and flexible for a limited time. A hardener is added to the film and after a chemical reaction between the resin and a hardener, prepreg 303 is cured and hardens. At higher temperatures, such as 120° C. this takes 15 minutes, at room temperature it takes 6 weeks. Pressure can also be used to harden prepreg 303, creating less air bubbles, which weaken the material. Film 302 represents an epoxy coating on prepreg 303. A film can be molded to a surface of virtually any curve or shape, unlike the conventional piezoelectric element of FIG. 1. The film can be used in piezoelectric devices that are more versatile than conventional piezoelectric elements.

FIG. 3B illustrates a non-limiting embodiment of a piezoelectric device. Device 304 is composed of film 302 that has electrodes attached to film 302 and is polarized with a strong electromagnetic field. Device 304 is flexible, allowing it to be applied to differently shaped surfaces.

FIG. 3C illustrates the application of a pre-cured piezoelectric film 308 to a handle of a tennis racquet 306. Since the piezoelectric devices of the present invention are flexible, they are suited to a vastly wider array of applications than the known brittle elements. This flexibility facilitates attachment to rounded or uneven surfaces such as tennis racquet handles. These embodiments refer to tennis racquets, but apply to racquets in general. Racquets are made up of a frame and handle. The piezoelectric device can be connected to the frame, the handle (as shown in the FIGS. 3A–3C above), or both.

Figure 4A:
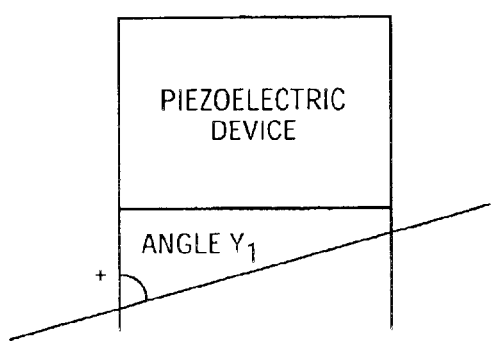
FIGS. 4A–4B illustrate various embodiments having different orientations between electrodes connected to piezoelectric devices consistent with the present invention.
Figure 4B:
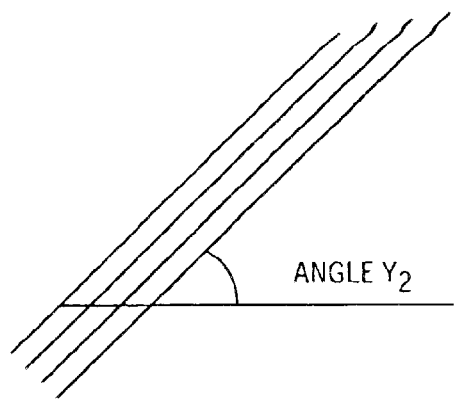

FIGS. 4A–4B illustrate various embodiments of a piezoelectric circuit having different orientation between electrodes connected to a piezoelectric device. FIG. 4A illustrates an orientations of piezoelectric electrodes with respect to a reference axis defined by the shortest distance between the ends of two electrodes. In FIG. 4B, angle Y represents an angle between the reference axis and carbon fibers formed within the frame of a tennis racquet that are arranged in parallel. In one non-limiting embodiment, this angle is 45 degrees.

Figure 4C:
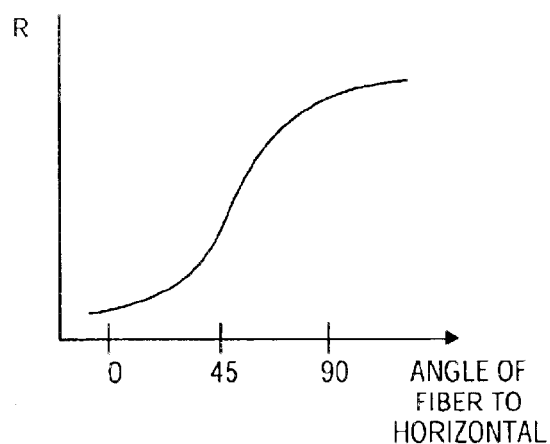
FIGS. 4C–4D are graphs illustrating the resistance of various embodiments depending on orientation.
Figure 4D:
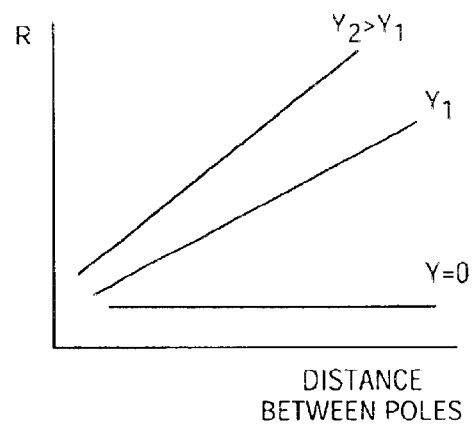

FIGS. 4C–4D are graphs illustrating the resistances of various embodiments depending on orientation. FIG. 4C is a graph illustrating the resistance between two points within a carbon fiber layer, depending on the orientation of the carbon fibers with respect to the reference axis. As indicated, a carbon fiber layer forms a piezoelectric circuit having a lowest resistance between two contacts that are oriented parallel to the carbon fibers. The highest resistance path across a carbon fiber layer is across a path, perpendicular to the carbon fibers.

FIG. 4D is a graph illustrating the relationship between the resistance and the distance between the electrodes of a piezoelectric device when connected to a layer of carbon fiber structure. When the angle of orientation of the carbon fibers and the piezoelectric device is zero, meaning the electrode contacts are connected to the carbon fiber layer parallel to the length of the carbon fibers, the resistance is low and approximately constant as the distance between poles is increased. However, as the angle of orientation increases towards 90 degrees, the resistance increases with the distance between the contacts or the poles of the electrodes. FIG. 4D shows that angle Y2 is greater that angle Y1, and the line associated with Y2 has a greater slope.

The term "member" refers to any structural material onto which the piezoelectric film is molded. The member vibrates either by external stimulus or by stimulus from the piezoelectric film.

The piezoelectric device can convert mechanical vibration into an electric voltage, this electric voltage can be processed by an electronic circuit to send a counter voltage to the piezoelectric device, which produces an opposing mechanical force to damp out the vibrations. The natural frequency of the structural material onto which the piezoelectric device is applied can also be used for damping. Every material has a natural frequency, including the material used to construct a tennis racquet. For example, in a tennis racquet the first order bending frequency can be 200 Hz. The second order bending frequency can be between 450 and 600 Hz.

An electric circuit comprising a capacitor and a resistor also has a natural frequency. The natural frequency is proportional to $$\frac{1}{\sqrt{RC}}.$$

Dampening can be maximized when the natural frequency of the circuit is equal to the natural frequency of the material. The piezoelectric film can provide capacitance to create an electric current. The current can have a frequency similar to that of the structural material. A resistor can be used to tune the frequency of the circuit to the natural frequency of the structural material. The physical parameters of the resistor can be varied to tune the frequency of the circuit. In one non-limiting embodiment, a natural resistor can be created by using orientation of carbon fibers in a tennis racquet as shown in FIGS. 4E–4F and the distance between the two electrodes. In an alternative embodiment, rather than utilizing a resistance as shown in FIGS. 4E–4F of a carbon fiber layer, a discrete resistor can be employed to tune the Resistance-Capacitor-Inductance (RCL) circuit. Other components including capacitors and inductors can be added to the circuit to tune the frequency of the circuit as is apparent to one of ordinary skill in the art of circuit design.

FIGS. 4E–4F illustrate various embodiments having different orientations of carbon fibers with respect to piezoelectric devices consistent with the present invention. As shown in connection with FIG. 4E, carbon fibers 400 in a carbon fiber layer on the external surface of a tennis racquet prepreg 410 can be oriented so that the carbon fibers 400 are substantially parallel. FIG. 4F illustrates how the contacts of the electrodes that are attached to a piezoelectric device 420 are connected to a carbon fiber layer so that a shortest path between the contacts travels a path that is substantially perpendicular to the paths of carbon fibers 430 in an outer carbon fiber layer.

Figure 4G:
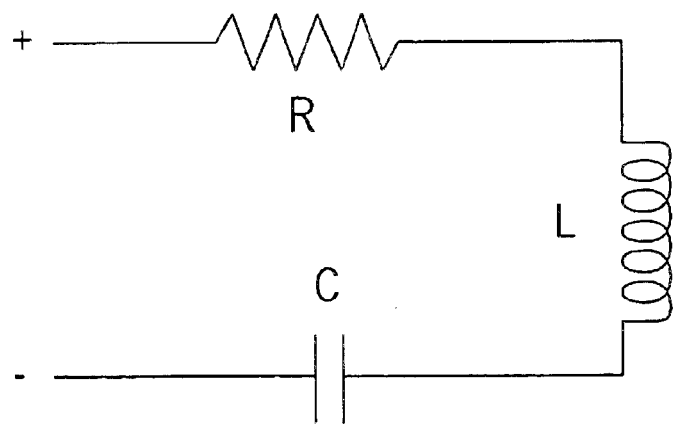
FIG. 4G illustrates a RCL circuit.
Figure 4E:
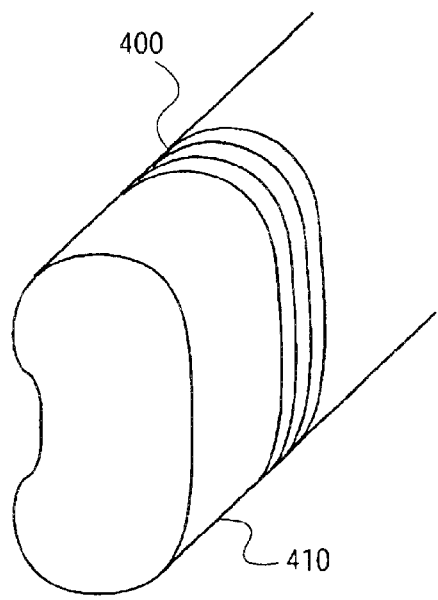
FIGS. 4E–4F illustrate various embodiments having different orientations of carbon fibers with respect to piezoelectric devices consistent with the present invention.
Figure 4F:
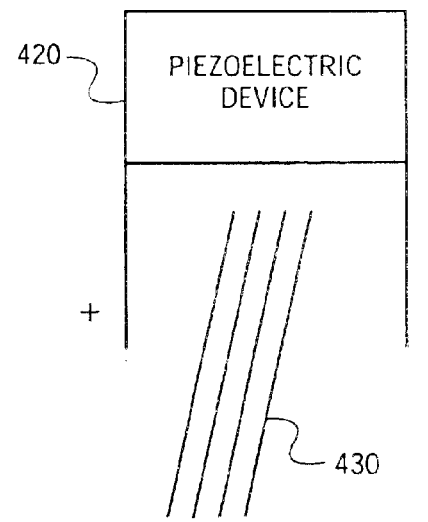

FIG. 4G illustrates an RCL circuit as is understood to one of ordinary skill in the art. Resistance R is the selected resistance that is determined by the orientation of the electrode contacts to the carbon fiber layer and the distance between the contacts as described in connection with FIG. 4D. Inductance L and capacitance C are natural characteristics of the piezoelectric device and its environment. The RCL circuit of FIG. 4G has a frequency that can be tuned by changing R, L, or C. In one non-limiting embodiment, R is changed. As described above, R can be changed by adjusting the angular orientation and distance between the electrodes or by adding a discrete resistor. In one non-limiting embodiment consistent with the present invention, a piezoelectric device can generate an electrical potential in response to vibrations generated by the actions of a tennis ball striking a tennis racquet. A frequency of the circuit is selected to generate an electrical potential that is capable of dampening the vibrations in the frame and handle of a tennis racquet. As is known to one of ordinary skill in the art this frequency is referred to as an eigen frequency. In one non-limiting embodiment, the frequency of the piezoelectric circuit equals to the eigen frequency of the racquet.

Figure 5A:
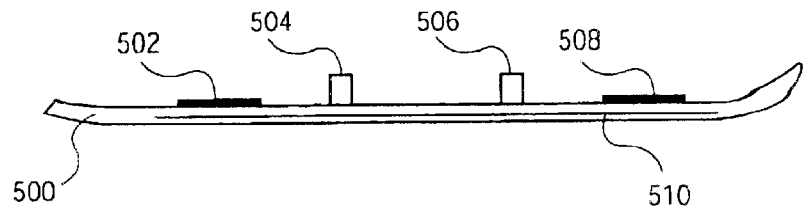
FIGS. 5A–5D illustrate various embodiments of different orientations of piezoelectric devices in skis consistent with the present invention.
Figure 5B:
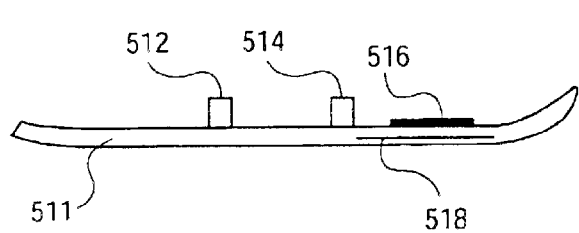
Figure 5C:
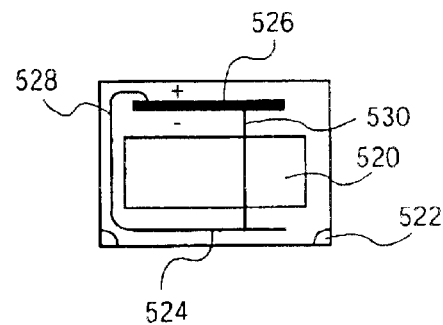

FIGS. 5A–5C illustrate various embodiments with various orientations of piezoelectric devices in ski apparatus consistent with the present invention. The term "skis apparatus" refers to alpine skis, cross-country skis, snowboards, parabolic capped skis, and skis or boards associated with any surface. In one non-limiting embodiment, ski apparatus work better when the bottom surface is heated. A piezoelectric device generating an electrical potential can apply the potential to a load resistance causing an electrical current to flow through the resistive load, thereby generating heat.

FIG. 5A illustrates a ski 500 having binders 504 and 506 and front piezoelectric device 508 and rear piezoelectric device 502. In one non-limiting embodiment, piezoelectric element 508 can be placed at or near the maximum bending area of the ski apparatus. Heating element 510 is a resistive load that generates heat when current is passed through it. In one non-limiting embodiment, heating element 510 can be a metal wire. Electrodes of piezoelectric devices 508 and 502 are connected to opposing ends of heating element 510, so that when current is generated by the vibration of piezoelectric devices 508 and 502, heat is generated by heating element 510.

FIG. 5B illustrates an alternative embodiment. Ski 511 has bindings 512 and 514. Piezoelectric device 516 is attached to ski 511 or optionally laminated to the core of a ski as described in connection with FIG. 5C. Heating element 518 is only in the front portion of ski 511.

FIG. 5C illustrates a cross sectional view of non-limiting embodiment of a ski consistent with the present invention. Core 520 is conventional and can be chosen from various materials, including but not limited to composite materials and wood. Heating element 524 can be laminated in the portion of the ski that is under the core. Wire 530 can pass through the core or optionally outside the core as illustrated in connection with wire 528. Piezoelectric device 526 is shown laminated above the core. Steel edges 522 are also heated by the effects of passing current through heating element 524 based on the electrical energy generated by the movement and vibration of piezoelectric device 526.

Figure 5D:
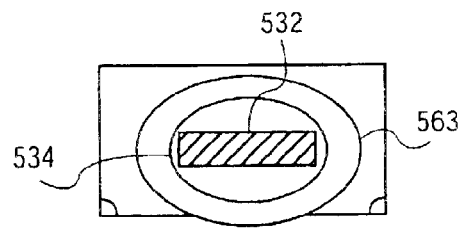

FIG. 5D illustrates a cross sectional view of another embodiment of a ski consistent with the present invention. Core 532 can be made out of wood or composite material or other materials known to one of ordinary skill in the art. Glass fiber layers 534 can be laminated around the outside of the core 532. A piezoelectric device 563 can be laminated outside glass fiber 534. In this embodiment, the piezoelectric device can generate electrical current that heats the ski. In another embodiment, the structure of the ski itself provides a resistive load through which current that is generated by the piezoelectric device can flow, thus generating heat and causing the ski to perform better.

The flexibility of piezoelectric films of the present invention allows these films to be incorporated into piezoelectric devices in a variety of applications where dampening or dissipating vibration is desirable. As discussed above, vibrations in racquets can be one non-limiting embodiment of such piezoelectric devices. These applications can dampen vibrations as described in the racquet embodiment, or dissipate vibrations in the form of heat as described in the ski embodiment.

Other embodiments of the invention will be apparent to those skilled in the art from consideration of the specification and practice of the invention disclosed herein. It is intended that the specification and examples be considered as exemplary only.

What is claimed is:

1. A circuit comprising:

a piezoelectric device, said piezoelectric device comprising a piezoelectric film and at least two electrodes, said piezoelectric film comprising a piezoelectric material and a flexible matrix material;

a member, wherein said electrodes contact said member;

whereby vibrations in said member can be dampened by tuning said circuit.

2. The circuit in claim 1, wherein:

said member comprises a resistance and a natural frequency, whereby said vibrations are dampened by tuning said circuit to said natural frequency of said member.

3. The circuit in claim 2, wherein:

said resistance can be adjusted by positioning carbon fibers within said member.

4. The circuit in claim 1, wherein:

said piezoelectric device is adapted to generate an electric potential, whereby said vibrations are dampened by adjusting said electrical potential to tune said circuit to a frequency of said vibrations.

5. The circuit of claim 4, wherein:

said member is a frame of a racquet.

6. The circuit of claim 4, wherein:

said member is a handle of a racquet.

7. The circuit of claim 1, wherein:

said member is at least a portion of a ski apparatus.

* * * * *